United States Patent
Barragy et al.

(10) Patent No.: US 10,349,555 B2
(45) Date of Patent: Jul. 9, 2019

(54) METHODS AND SYSTEM FOR OIL IMMERSION COOLING

(71) Applicant: CGG SERVICES SAS, Massy (FR)

(72) Inventors: Edward Joseph Barragy, Richmond, TX (US); Cemil Ozyalcin, Herndon, VA (US)

(73) Assignee: CGG SERVICES SAS, Massy (FR)

( * ) Notice: Subject to any disclaimer, the term of this patent is extended or adjusted under 35 U.S.C. 154(b) by 0 days.

(21) Appl. No.: 15/490,031

(22) Filed: Apr. 18, 2017

(65) Prior Publication Data
US 2017/0311479 A1    Oct. 26, 2017

Related U.S. Application Data

(60) Provisional application No. 62/324,894, filed on Apr. 20, 2016.

(51) Int. Cl.
*H05K 7/20* (2006.01)
*H05K 7/14* (2006.01)

(52) U.S. Cl.
CPC ....... *H05K 7/20236* (2013.01); *H05K 7/1488* (2013.01); *H05K 7/20263* (2013.01); *H05K 7/20772* (2013.01); *H05K 7/20781* (2013.01)

(58) Field of Classification Search
CPC ............. H05K 7/20236; H05K 7/1488; H05K 7/20263; H05K 7/20781
See application file for complete search history.

(56) References Cited

U.S. PATENT DOCUMENTS

| | | | | |
|---|---|---|---|---|
| 5,349,499 A | * | 9/1994 | Yamada | H01L 23/427 165/104.33 |
| 7,724,524 B1 | * | 5/2010 | Campbell | H05K 7/20772 165/104.19 |
| 7,905,106 B2 | | 3/2011 | Attlesey | |
| 8,724,322 B2 | | 5/2014 | Rinke | |
| 9,596,787 B1 | * | 3/2017 | Iyengar | H05K 7/203 |
| 2003/0147214 A1 | * | 8/2003 | Patel | G06F 1/20 361/699 |
| 2007/0281639 A1 | * | 12/2007 | Clidaras | G06F 1/20 455/128 |

(Continued)

FOREIGN PATENT DOCUMENTS

| | | |
|---|---|---|
| DE | 20 2005 002 390 U1 | 7/2005 |
| EP | 2802197 A1 | 11/2014 |

OTHER PUBLICATIONS

CoolIT Systems, Rack DCLC Product Guide, Direct Contact Liquid Cooling (DCLC), 2016, CoolIT Systems, Inc., www.coolitsystems.com.

(Continued)

*Primary Examiner* — David M Sinclair
*Assistant Examiner* — Robert D Brown
(74) *Attorney, Agent, or Firm* — Patent Portfolio Builders PLLC

(57) ABSTRACT

A system for immersion cooling computing system equipment includes a container, a volume of cooling liquid disposed in the container, a computing system equipment holder disposed in the volume of cooling liquid and a liquid-liquid heat exchanger attached to and supported by the computing system equipment holder. The liquid-liquid heat exchanger is disposed in the volume of cooling liquid.

19 Claims, 7 Drawing Sheets

(56) References Cited

U.S. PATENT DOCUMENTS

| | | | |
|---|---|---|---|
| 2010/0103618 A1* | 4/2010 | Campbell | H05K 7/20236 361/699 |
| 2010/0290190 A1* | 11/2010 | Chester | H05K 7/20772 361/701 |
| 2011/0132579 A1 | 6/2011 | Best et al. | |
| 2011/0315353 A1* | 12/2011 | Campbell | H05K 7/20809 165/104.31 |
| 2013/0025818 A1* | 1/2013 | Lyon | H05K 7/20781 165/11.1 |
| 2013/0312839 A1* | 11/2013 | Shelnutt | G06F 1/20 137/15.01 |
| 2014/0211412 A1 | 7/2014 | Best | |
| 2014/0301037 A1* | 10/2014 | Best | H05K 7/20781 361/679.53 |
| 2014/0307384 A1 | 10/2014 | Best | |
| 2015/0150761 A1* | 6/2015 | Lanternari | A47J 36/24 426/115 |
| 2015/0359132 A1* | 12/2015 | Campbell | H05K 7/20236 361/700 |
| 2016/0014932 A1* | 1/2016 | Best | H05K 7/20763 361/679.53 |
| 2017/0049009 A1* | 2/2017 | Steinke | H05K 7/20781 |
| 2017/0181324 A1* | 6/2017 | Shelnutt | H05K 7/20781 |
| 2017/0295676 A1* | 10/2017 | Conn | G06F 1/181 |
| 2018/0020571 A1* | 1/2018 | Saito | G06F 1/20 |

OTHER PUBLICATIONS

Extended European Search Report in corresponding EP Application No. 17305425.5-1803, dated Aug. 28, 2017. All references not cited herewith have been previously made of record.

* cited by examiner

METHODS AND SYSTEM FOR OIL IMMERSION COOLING

CROSS REFERENCE TO RELATED APPLICATIONS

This application claims priority and benefit from U.S. Provisional Patent Application No. 62/324,894, filed Apr. 20, 2016, for "Methods and System for Oil Immersion Cooling Number 2", the entire contents of which is incorporated herein by reference.

TECHNICAL FIELD

Embodiments of the subject matter disclosed herein generally relate to methods and systems for oil immersion cooling of computing systems.

BACKGROUND

Seismic data acquisition surveys include both land and seabed surveys that utilize seismic receivers arranged in a pattern or grid on either the land or seabed. The seismic receivers or seismic nodes are attached at various points along the length of a cable, and the seismic data acquisition grid is defined by placing multiple cables in spaced parallel lines. The seismic sources or seismic shots are then created by towing or driving one or more seismic signal generators such as a seismic gun along tow lines or paths, e.g., shot lines, that are perpendicular to the arrangement of the parallel cables. The seismic signal generators are then actuated at multiple locations along the tow lines or paths and the resulting seismic signals are recorded at the seismic receivers on the cables. The recorded seismic signals are then processed and analyzed to yield a three dimensional (3D) image of the subsurface below the seismic data acquisition grid.

Computing systems are utilized to control all aspects of the seismic data acquisition surveys including the collection and processing of seismic data. Due to the large volume of data collection and the complexity involved in processing the data, a significant amount of computing power is required. Computing systems with the required amount of computing power generate significant heat and need to be cooled. As seismic data acquisition surveys typically occur in remote areas or at sea, the computing systems and associated cooling mechanisms need to be both robust and portable. In addition, the need to control or limit power consumption in the field places a further constraint on these computer systems and cooling mechanisms.

The need to cool computing systems such as large server farms and the energy costs associated with the cooling of these computing systems drive the development of innovative and energy efficient cooling systems. These more energy efficient cooling systems favor oil immersion cooling over forced air systems or cooling fluid circulated heat sinks or cooling jackets. In an oil immersion cooling system, the computing components to be cooled are at least partially immersed in dielectric oil. The dielectric oil, being in contact with the computing components, conducts heat away from the computing components. To remove the transferred heat from the dielectric oil, the dielectric oil is circulated, for example, using a pump, through a heat exchanger, through which a separate cooling liquid is also circulated. This heat exchanger can be located external to the container holding the dielectric oil and the computing components or internal to the container.

An example of a liquid immersion cooling solution for data center servers is the CarnoJet System, which is commercially available from Green Revolution Cooling of Austin, Tex. The CarnoJet System utilizes a 'pump module' containing a primary pump, a secondary pump, an oil/water heat exchanger, and a control mechanism. Associated with each pump module is one or more custom built steel tanks filled with heat generating information technology (IT) equipment immersed in the dielectric coolant termed GreenDef, which is broadly similar to mineral oil. The IT equipment in the tank is supported on a built in 'rack' rail system. The pump module and tanks are connected via hoses. The pump circulates oil through the heat exchanger and back to the tanks. Cooling water is supplied to the heat exchanger via and external source. While this system cools high thermal density IT equipment very effectively, it has several shortcomings particularly regarding cost, size and complexity.

Therefore, effective liquid immersion cooling system are desired that provide for effective cooling of the components of a computing system in a cost-effective and simple arrangement that is portable and suitable for use in field application such as those required by seismic data acquisition surveys.

SUMMARY

Embodiments are directed to systems and methods for immersion cooling of computing system equipment for cost effective and rapid deployment in remote locations. A modular, low cost, liquid cooled heat exchanger for oil immersion cooling, i.e., a liquid-liquid heat exchanger, is utilized in conventional or standard rack mounted computing system or information technology (IT) equipment, for example, server racks and server chassis. Cooling the computing system involves the circulation through the liquid-liquid heat exchanger of a first fluid, i.e., the cooling fluid in which the computing system equipment is immersed, and the circulation of a second fluid, i.e., the fluid used to cool or remove heat from the cooling liquid. The first fluid, i.e., the cooling fluid, the circulation of the cooling fluid and the liquid-liquid heat exchanger are all located within the container holding the cooling fluid and heat generating computing system equipment, eliminating the need for external pumps to circulate the cooling fluid. The second fluid, e.g., water, is provided from a variety of external sources available at the location where the computing system equipment and cooling system are deployed.

Exemplary embodiments utilize commercially available containers to hold the cooling fluid and incorporate computing system equipment, computing system racks and server chassis into those containers and the cooling fluid contained in those containers. In addition, one or more of the commercially available server chassis that are placed in the containers are modified to incorporate heat exchangers and pumps. The result is a low cost container and server rack system that provides liquid immersion cooling for heat generating computing system equipment. This low cost container and rack system yields a significant overall capital cost reduction compared to the other commercially available oil immersion cooling systems.

Exemplary embodiments are directed to a system for immersion cooling computing system equipment. The system includes a container, a volume of cooling liquid disposed in the container, a computing system equipment holder disposed in the volume of cooling liquid and a liquid-liquid heat exchanger attached to and supported by the computing system equipment holder. The liquid-liquid heat exchanger is disposed in the volume of cooling liquid.

Exemplary embodiments are also directed to a system for immersion cooling computing system equipment that includes an intermediate bulk container of a high density polyethylene tank, a volume of dielectric oil disposed in the tank and at least one server rack disposed in the dielectric oil. The server rack includes a rack top, a rack bottom opposite the rack top, a rack front extending between the rack top and the rack bottom, a rack back opposite the rack front and extending between the rack top and the rack bottom and a plurality of rack shelves disposed in the server rack and extending from the rack front to the rack back parallel to the rack top and the rack bottom. The server rack is disposed in the container with the rack back adjacent a bottom of the tank and the plurality of rack shelves extending vertically through the container. The system also includes a server chassis attached to and supported by the computing system equipment holder. The server chassis is disposed on one of the plurality of rack shelves in the volume of dielectric oil. A liquid-liquid heat exchanger is disposed in the sever chassis and is fluid communication with the volume of dielectric oil.

Exemplary embodiments are also directed to a method for immersion cooling computing system equipment. The method includes removing a top of a high density polyethylene tank in an intermediate bulk container comprising a volume of dielectric oil, placing at least one server rack in the dielectric oil in the tank such that a rack back is disposed adjacent a bottom of the tank and a plurality of rack shelves disposed in the server rack and extending vertically through the container, integrating a liquid-liquid heat exchanger into a server chassis, inserting the server chassis into one of the plurality of rack shelves such that the liquid-liquid heat exchanger is in communication with the volume of dielectric oil and inserting at least one computing component server chassis into one of the plurality of rack shelves in the volume of dielectric oil. The computing component server chassis includes heat generating computing components.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
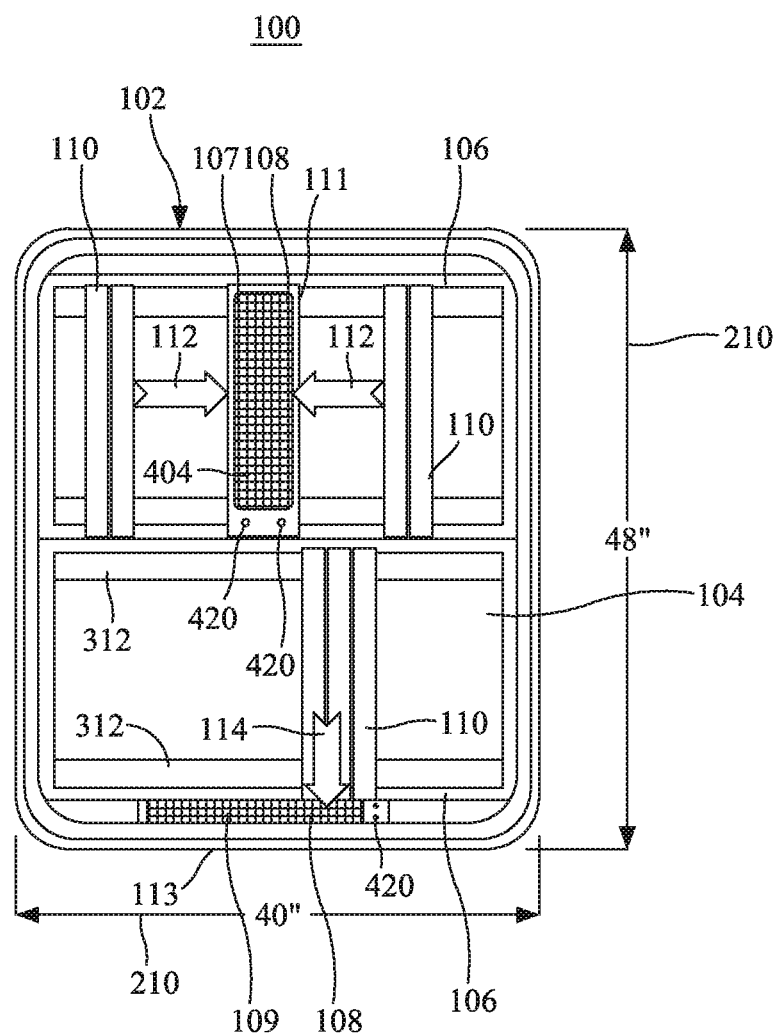
FIG. 1 is a top view of a system for immersion cooling of computing system equipment.

The following description of the embodiments refers to the accompanying drawings. The same reference numbers in different drawings identify the same or similar elements. The following detailed description does not limit the invention. Instead, the scope of the invention is defined by the appended claims. In one embodiment, the system is deployed in a standard type of datacenter. In another, less expensive embodiment, the system is deployed in a warehouse or 'pole barn'. In one embodiment, the system is deployed to a field location inside a shipping container and placed near a source of cooling water, for example seawater or an evaporative pond in desert applications.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Exemplary embodiments of systems and methods provide improvements to immersion cooling systems for heat generating computer equipment. The improved system for immersion cooling of computing system equipment includes multiple parts that can be utilized individually or in combination. These parts include low cost commodity containers or tanks that are used for shipping the cooling fluid, transporting the complete system for immersion cooling of computing system equipment and operating the computing or information technology (IT) system equipment on site. Suitable low cost commodity tanks include, but are not limited to, carboys, plastic water tanks, horizontal hauling tanks, fiberglass tanks, fuel tanks, pest control operator (PCO) liquid transport tanks and Intermediate Bulk Container (IBC) tanks including caged IBC tanks. Suitable materials for the tanks include, but are not limited to, plastics, elastomers, metals, fiberglass and combinations thereof. In one embodiment, the tanks are high density polyethylene (HDPE) tanks. These tanks are modified, preferably on site, to remove the top of the tanks to facilitate insertion of the components for the system for immersion cooling of computing system equipment.

The system also includes a volume of a cooling fluid suitable for immersion of the computing system equipment and compatible with the operation of the computing system equipment while immersed. Suitable cooling fluids include dielectric fluids such as dielectric oils including mineral oils, silicon oils and vegetable oils. Suitable dielectric immersion oils are known and available in the art. Each volume of cooling fluid is self-contained within a given container. In one embodiment, the immersion cooling fluid is shipped in the tanks to be used to contain the system for immersion cooling of computing system equipment. Therefore, the immersion cooling fluid is shipped to site in the tank, and the tank is modified on site to include the components of the system for immersion cooling of computing system equipment. Circulation of the immersion cooling fluid occurs within the container, which is passed through a liquid-liquid heat exchanger that is also contained within the tank. Also, routed through the liquid-liquid heat exchanger is a secondary cooling fluid, e.g., water, that is used to cool the immersion cooling fluid and that is routed to each container or tank individually.

Within each container or tank and immersed in the cooling fluid are commercially available, low cost, lightweight computing equipment racks such as server racks having a plurality of shelves to hold server chassis or other computing equipment. Typically, these shelves are horizontal, running from the front to the back of the computing equipment racks. The racks are arranged with a rack bottom that can carry the weight of all the server chassis. When placed in the container with the immersion cooling fluid, however, the computer equipment racks are placed with the rack back adjacent the bottom of the container and the shelves in a vertical orientation. Therefore, the rack back of the computing equipment rack is carrying the weight, and structural improvements are made to each computing equipment rack to facilitate carrying weight by the rack back and to accommodate forces applied to the computing equipment rack during shipping and field deployment of the system for immersion cooling of computing system equipment. Suitable structural improvements include, but are not limited to, additional welds or fasteners at the points of contact between the rack shelves and the computing system rack frame and addition structural members including single force and two force members and cross members.

The system for immersion cooling of computing system equipment also includes one or more of the liquid-liquid heat exchangers disposed within the tank or container to provide for cooling of the immersion cooling fluid. Suitable liquid-liquid heat exchangers include modular liquid-liquid heat exchangers. The liquid-liquid heat exchangers are attached to and supported by the computing equipment racks. In one embodiment, the number, size and location of the liquid-liquid heat exchangers are selected based upon the cooling requirements of the immersed, heat generating computing equipment to be cooled. The liquid-liquid heat exchangers can be attached directly to the computing system equipment holders or racks, for example, using the rack shelves. In one embodiment, each liquid-liquid heat exchanger is incorporated into commercially available computing system equipment that either contain computing system equipment components or are barebones units, including heat generating computing equipment that is supported by the computing equipment racks. Suitable commercially available computing system equipment includes, but is not limited to, server chassis including barebones server chassis. As used herein, server chassis includes barebones server chassis and server chassis containing power supplies and other computing equipment including heat generating computing equipment. Circulation of the cooling fluid can be provided by fans in the commercially available computing system equipment. Alternatively, small pumps available from marine and oil pumping applications can be incorporated into the commercially available computing system equipment, i.e., to replace the fans. These pumps run at the available DC current, e.g., 12 VDC, in the computing system equipment. Clogs resulting from debris in the immersion cooling fluid are avoided by incorporating one or more modular strainers such as basket strainers in the flow path of the immersion cooling fluid through the computing system equipment.

The immersion cooling fluid is contained in the tank at all times, and the secondary cooling fluid, e.g., water, for the liquid-liquid heat exchanger is routed to each tank individually and to heat exchangers immersed in the tank and cooling fluid. This eliminates the need for external hoses, pumps and heat exchangers for the immersion cooling fluid. The need for balancing the level of cooling fluid in each tank and fluid spills associated with tank overflows due to pressure differentials across tanks are eliminated. In addition to being used for field deployable computing systems, the system for immersion cooling of computing system equipment is compatible with existing datacenters that are already plumbed to bring cooling water to each rack position, which reduces infrastructure upgrade costs and lead times in retrofit scenarios.

Figure 2:
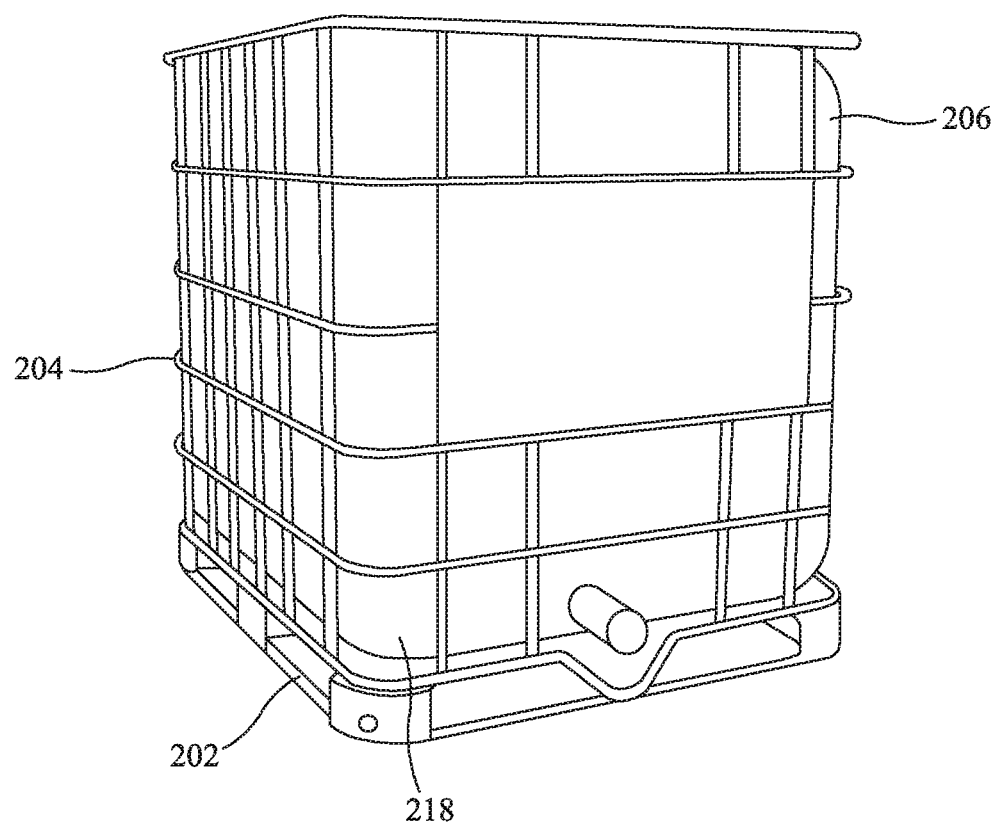
FIG. 2 is a perspective view from the side of an embodiment of an intermediate bulk container.
Figure 3:
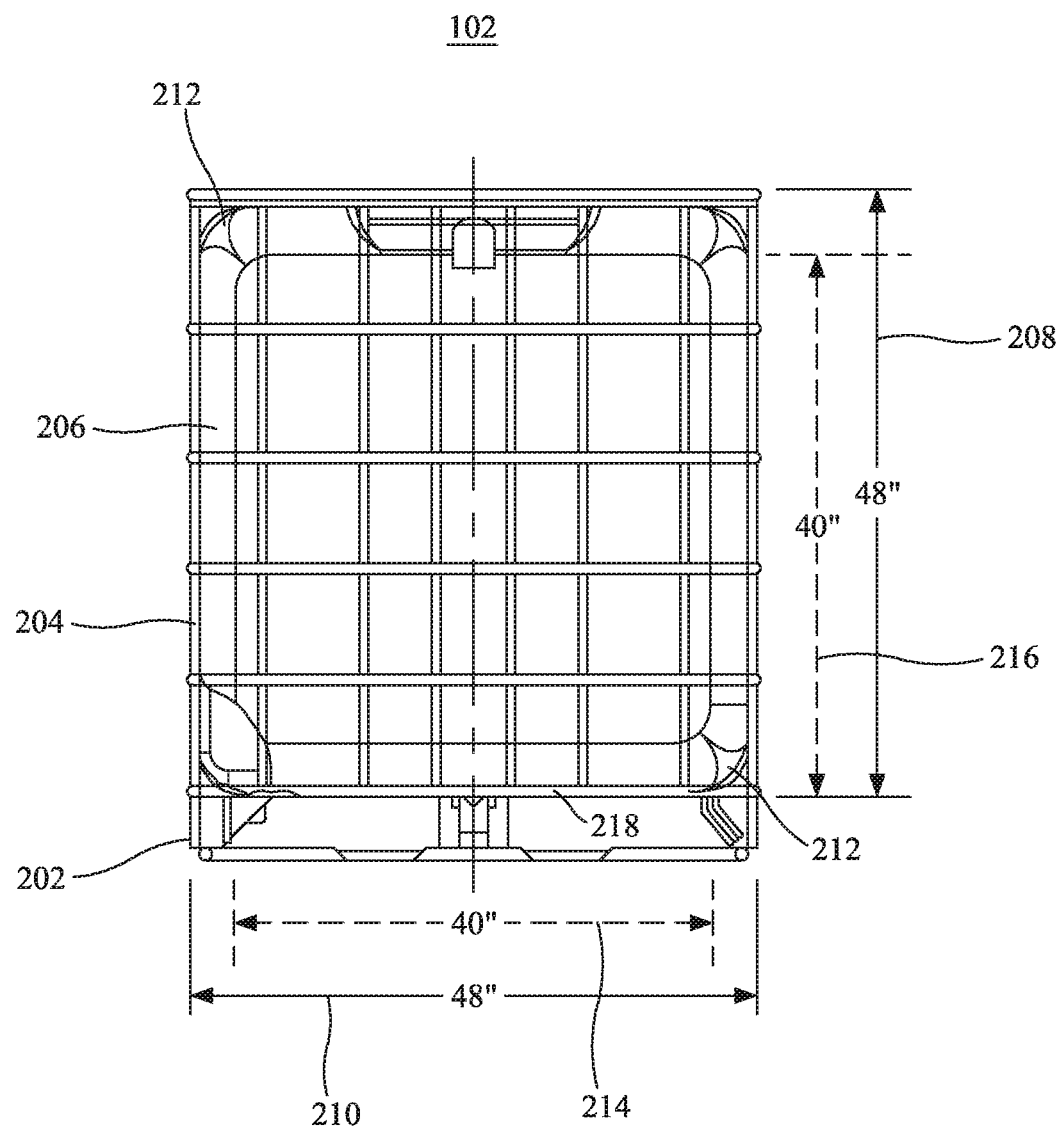
FIG. 3 is a side view of the intermediate bulk container.

Referring initially to FIG. 1, exemplary embodiments are directed to a system for immersion cooling computing system equipment 100. The system includes at least one container 102. Referring to FIGS. 2 and 3, in one embodiment, the container 102 is an intermediate bulk container having a pallet base 202, a metal frame 204 or metal cage, e.g., a galvanized or stainless steel cage, extending up from the pallet base and a plastic tank 206 supported by the pallet base and surrounded by the metal frame. Preferably, the plastic tank is made of a polymer such as HDPE.

Therefore, the plastic tank is enclosed and supported by the metal cage, and the metal cage is connected to and the plastic tank rests on an integrated galvanized or stainless steel pallet base. In general, IBC tanks are widely available and International Organization for Standardization (ISO) certified for shipping various types of fluids. These tanks are compatible with worldwide intermodal freight transport and are movable on site using forklifts. The use of IBC tanks minimizes the lead times needed to procure tanks and cooling fluids. In fact, such tanks are widely available in a variety of industries including the oil refining industry. In addition, ISO approved containers can be shipped quickly and inexpensively to any part of the world. The HDPE container is easily modified in the field. As IBC tanks are commodity items, the associated cost is low. In one embodiment, the IBC tank is a 330 gallon tote. Suitable IBC tanks have an overall height 208 of about 48 inches (122 cm) to about 53 inches (135 cm). These tanks have a rectangular or square shape with exterior side dimensions 210 of from about 40 inches (102 cm) up to about 48 inches (122 cm). The corners 212 of the tank have a curvature with a typical radius of from about 2 inches (5 cm) to about 4 inches (10 cm). This yields interior side dimensions 214 of up to about 40 inches (102 cm) in depth.

In one embodiment, the top of the HDPE tank is removed at a height 216 of from about 44 inches to about 46 inches (112 cm to 117 cm) above the bottom 218 of the tank. The placement of the cut depends on the radius of curvature of the corners of the tank, e.g., blow molded HDPE. The internal height of the tank corresponds to the height or depth of the immersion cooling fluid in the tank. Depending on the manufacturer of the tank, these internal dimensions may be as large as about 44 inches (112 cm) by about 36 inches (91 cm) in width and about 46 inches (117 cm) in height or depth. In one embodiment, the usable internal dimensions of the tank, given the radius of curvature of the corners, are at a minimum about 40 inches (102 cm) by about 32 inches (81 cm) in width and 44 inches (112 cm) in height or depth.

Returning to FIG. 1, the system also includes a volume of cooling liquid 104 disposed in the container. The cooling liquid is contained within the plastic tank portion of the container. Suitable cooling liquids include, but are not limited to, dielectric oils. In one embodiment, IBC tanks or totes are used to contain the cooling fluid. The cooling fluid is shipped in bulk in the IBC tanks, and the IBC tanks are modified on site with hand tools to remove the top of the tank at the desired height above the bottom of the tank. This modification of the tank also corresponds to and defines the limit of the depth of the cooling fluid in the plastic tank. The components of the system for immersion cooling of computing system equipment can then be inserted into the plastic tank through the open top of the tank for immersion in the cooling fluid.

Figure 4:
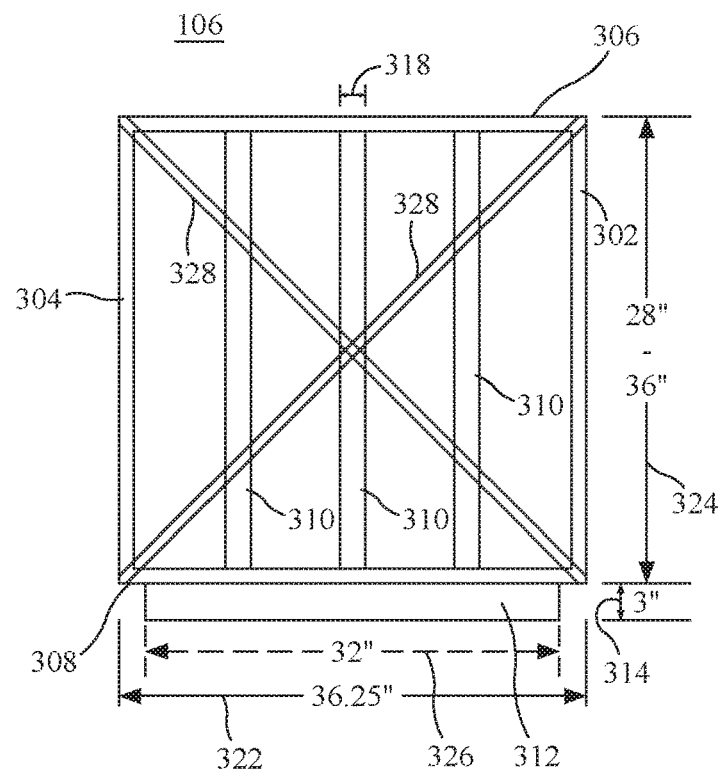
FIG. 4 is a side view of an embodiment of a computing system equipment holder.
Figure 5:
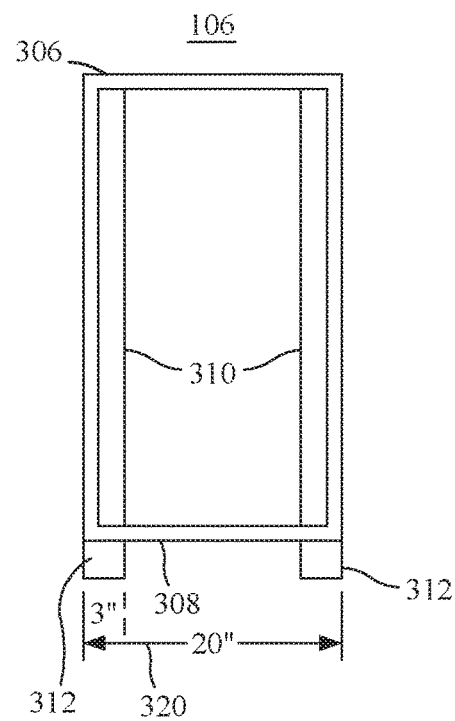
FIG. 5 is an end view of the computing system equipment holder.

The system also includes at least one computing system equipment holder 106 disposed within the plastic container and in the volume of cooling liquid. In one embodiment, the system includes a plurality of computing system equipment holders or a plurality of server racks. For example, the system includes two computing system equipment holders placed side by side inside the plastic tank. Referring now to FIGS. 4 and 5, in one embodiment, the computing system equipment holder or rack is a server rack 106 having a rack top 302, a rack bottom 304 opposite the rack top, a rack front 306 extending between the rack top and the rack bottom and a rack back 308 opposite the rack front and extending between the rack top and the rack bottom. The server rack also includes a plurality of rack shelves 310 disposed in the server rack and extending from the rack front to the rack back parallel to the rack top and the rack bottom. As used herein, rack shelves include any type of rack shelving units including complete shelves and rack rails or shelf rails. The server rack is disposed in the container with the rack back adjacent to the bottom of the container and the plurality of rack shelves extending vertically through the container.

The computing system equipment holder also includes a plurality of plastic runners 312 disposed between the rack back and the bottom of the container, each plastic runner having a thickness 314 measured up from the bottom of the plastic tank of up to about three inches. The plurality of rack shelves is spaced from each other along the rack front and the rack back of the server rack from the rack bottom to the rack top. Each rack shelf has a height 318 along the rack front and the rack back. This height varies from one rack unit to seven rack units. In one embodiment, the computing system equipment holders or racks have a width 320 from side to side of from about 20 inches to about 20.5 inches (51 cm-52 cm). This width allows a plurality of computing system equipment holders or racks to be placed inside the tank. For example, two computing system equipment holders or racks are placed side-by-side in the tank. The computing system equipment holder or rack has a depth 324 from rack front to rack back of about 28 inches (71 cm) to about 36 inches (91 cm). In addition, the computing system equipment holder or rack has a height 322 from the rack bottom to the rack top of about 36.25 inches (92 cm), which provides total of 19 rack units (19U, 33.25 inches or 84.5 cm) of space for IT equipment. Other standard size racks can also be used including, for example, wider 24 inch racks.

In one embodiment, standard computing system equipment or IT equipment four post 'open frame' racks or 'wall mount' racks are used. These computing system equipment holders or racks are typically of lighter construction and smaller width than closed or adjustable frame racks. However, these lighter frame computing system equipment holders or racks do accommodate standard 19 inch (48 cm) rack mount IT equipment. These conventional computing system equipment holders or racks are rotated 90 degrees from conventional orientation. Therefore, the depth dimension of the computing system equipment holders or racks corresponds to a height of the computing system equipment holder or rack in the container, and the width dimension of the computing system equipment holder or rack in the container corresponds to the height of the computing system equipment holder or rack in a conventional orientation. To facilitate flow of the cooling fluid under the holder or rack and the computing system equipment contained in the holder or rack, the rack back is not placed in direct contact with the bottom of the container but is placed on a plurality of runners extending along the width of the computing system equipment holders or racks, i.e., the height of the holders or racks in a conventional orientation. Suitable materials for the runners include, but are not limited to metals, elastomers, polymers such as HDPE and combinations thereof. In one embodiment, the runners are attached to the computing equipment rack. Alternatively, the computing equipment rack merely rests on the runners. Suitable dimensions for each runner include a length 326 of from about 32 inches (81 cm) up to about 36 inches (91 cm) and a rectangular cross section having dimensions 314 of up to about 3 inches (8 cm) by up to about 3 inches (8 cm). Each runner can also include tapering that mirrors any tapering of the interior dimensions of the container. Each runner can have holes or be segmented with gaps to allow oil circulation through the runner.

The runners provide three functions, cushioning the bottom of the tank from the metal of the rack, supporting the IT equipment in the rack directly, i.e., the computing system equipment is inserted in the rack and rests (on each outer edge) directly on the runners and elevating the IT equipment up to about 3 inches (8 cm) from the bottom of the tank, providing a consistent space for the immersion cooling fluid to circulate. The height of the runners, i.e., the spacing of above the bottom of the container or tank, can be increased as desired with plastic boards such as HDPE boards that are available from industrial suppliers in increments of 1 inch (2.5 cm) in thickness and width. The IT equipment is primarily supported on the HDPE runners.

Steel support strapping 328 is shown in a diagonal cross configuration. This provides lateral strength to the frame. The support strapping can be either bolted or spot welded to the frame. Three, two rack unit (2U) adjustable shelf rails are illustrated. However, the number of rack shelves or rack rails can be more or less than three. The dimensions of the shelf rails are approximately 2.5 inches×2.5 inches×an adjustable 28 inches to 36 inches (6.4 cm×6.4 cm×71-91 cm). The rack shelves are bolted to the top and bottom of the rack frame in the standard way and then spot welded to provide a rigid vertical support. The rack shelves or shelf rails hold the computing system equipment such as server chassis vertically on the computing system equipment holder or rack and prevent the server chassis from tilting laterally in the computing system equipment holder or rack frame.

Returning to FIG. 1, the system also includes at least one liquid-liquid heat exchanger unit 108 that includes at least one liquid-liquid heat exchanger and is attached to and supported by the computing system equipment holder. The liquid-liquid heat exchanger is disposed in the volume of cooling liquid. In one embodiment, the system includes a plurality of liquid-liquid heat exchanger units 108 containing a plurality of liquid-liquid heat exchangers, for example, one or more internally mounted liquid-liquid heat exchanger units 107 and one or more externally mounted liquid-liquid heat exchanger units 109. Each liquid-liquid heat exchanger is attached to and supported by the computer equipment holder, and each liquid-liquid heat exchanger is disposed in the volume of cooling liquid. In one embodiment, the liquid-liquid heat exchanger unit 107 and the liquid-liquid heat exchanger are disposed in one of the plurality of rack shelves. Alternatively, the liquid-liquid heat exchanger unit 109 and the liquid-liquid heat exchanger are disposed outside the computing system equipment holder. In one embodiment, the liquid-liquid heat exchanger unit is just the liquid-liquid heat exchanger, which is attached directly to the computing system equipment holder, either on the outside or on the inside, i.e., on one of the rack shelves.

Figure 6:
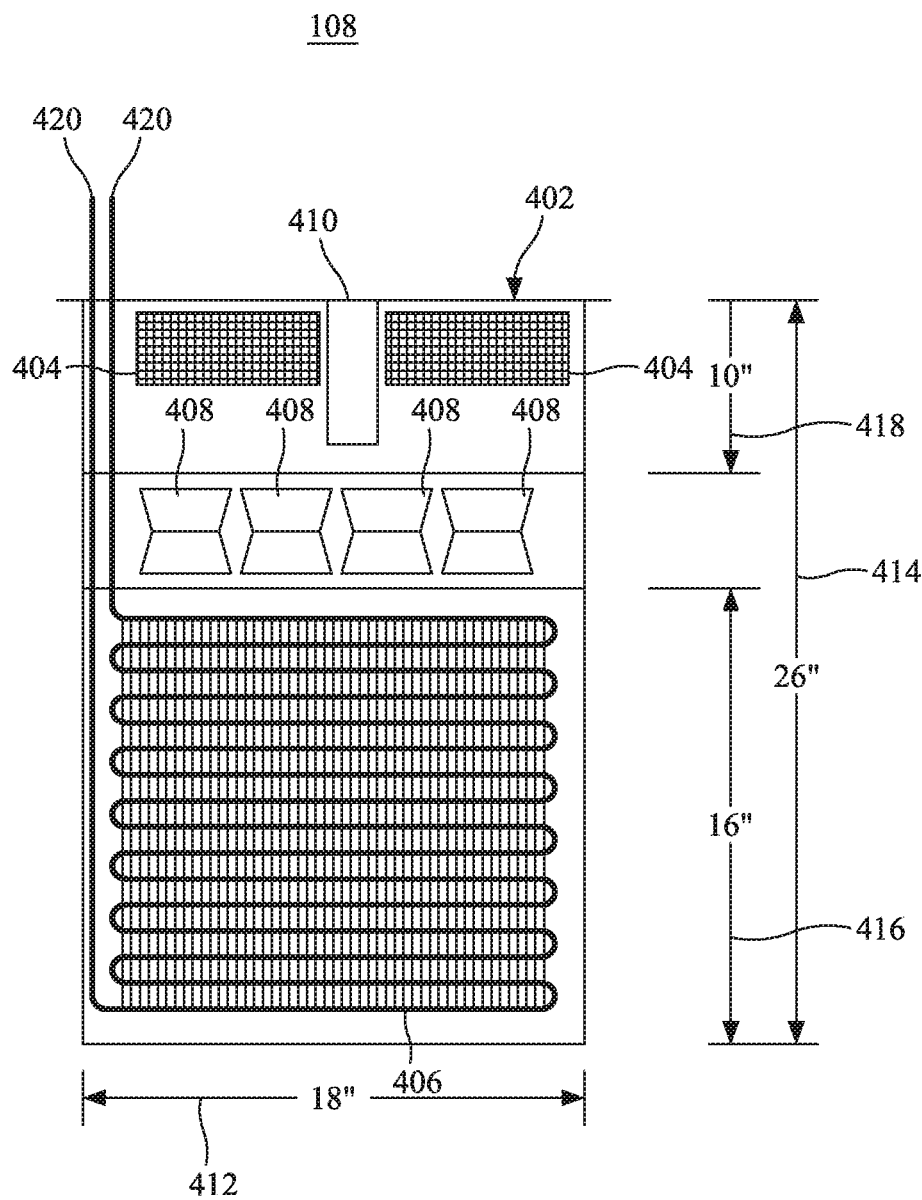
FIG. 6 is a schematic representation of an embodiment of a liquid-liquid heat exchanger unit.

Referring to FIG. 6, in one embodiment, the liquid-liquid heat exchanger unit 108 includes a barebones server chassis

402 attached to and supported by the computing system equipment holder. The server chassis is disposed vertically in the volume of cooling liquid, and the liquid-liquid heat exchanger 406 is disposed in the server chassis. In one embodiment, the server chassis is modified to be the liquid-liquid heat exchanger unit and to include at least one of the liquid-liquid heat exchanger, at least one or a plurality of basket strainers 404 and at least one or a plurality of cooling fluid circulators 408. Suitable cooling fluid circulators include fans and pumps. In one embodiment, the server chassis includes a plurality of cooling fluid circulators. The number of cooling fluid circulators is N+M redundant, where N is the number of cooling fluid circulators required for proper flow of the cooling fluid through the system for immersion cooling of computing system equipment and M is the number of redundant units in case of failures. The cooling fluid circulators can operate to pull the immersion cooling fluid up from the bottom or pull the immersion cooling fluid down from the top. At least one cooling circulator is disposed between the basket strainer and the liquid-liquid heat exchanger. In one embodiment, the server chassis has a width 412 of about 18 inches (46 cm) and a depth 414 of about 26 inches (66 cm). The basket strainers extend into the server chassis a depth 418 of up to about 10 inches (25 cm), and the liquid-liquid heat exchanger 406 extends up from the bottom of the server chassis a height 416 of about 16 inches (41 cm).

Piping 420 for providing the secondary cooling fluid to the liquid-liquid heat exchanger is routed into the tank through the open top. Suitable secondary cooling fluids include, but are not limited to water, including water derived from well water and surface water sources available on site. In addition, all of the immersed computing system equipment, support racks, computing system equipment chassis and liquid-liquid heat exchangers are placed into the tank through the open top. In one embodiment, the server chassis includes at least one power supply 410 to supply the needed power to the cooling fluid circulators. In one embodiment, the power supply is located adjacent the basket strainers.

Figure 7:
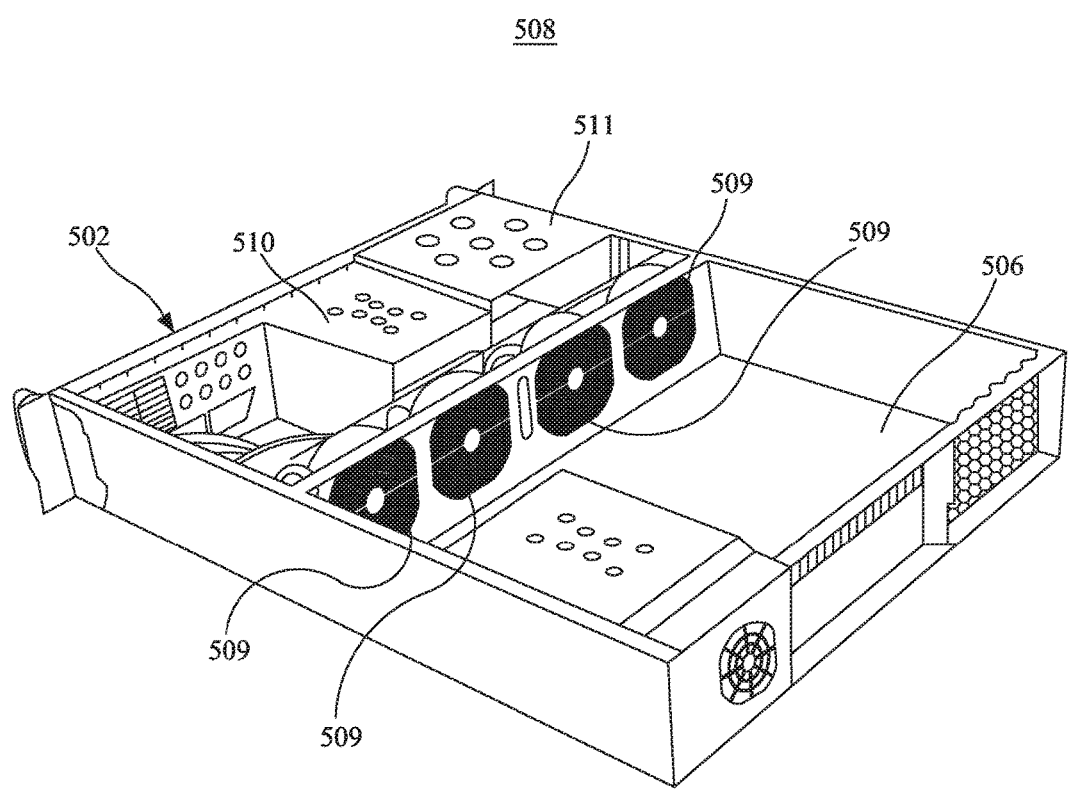
FIG. 7 is a perspective view of an embodiment of a server chassis to be modified to include a liquid-liquid heat exchanger.

Referring now to FIG. 7, in one embodiment, the liquid-liquid heat exchanger unit 508 is a server chassis 502, which in one embodiment contains at least one of heat generating computing components 511, a power supply 510, at least one cooling fluid circulator 509 or a plurality of cooling fluid circulators as described above and the liquid-liquid heat exchanger. The liquid-liquid heat exchanger is located in a cavity 506 of the server chassis such that the at least one cooling fluid circulator is disposed between the heat generating computing components and the liquid-liquid heat exchanger.

Exemplary embodiments utilize a modular liquid-liquid heater exchanger unit that includes at least one of a strainer, cooling fluid pump and liquid-liquid heat exchanger. In one embodiment, the liquid-liquid heater exchanger unit has standard dimensions for 19" (48 cm) rack mount IT equipment. This facilitates mounting in the server rack alongside the heat generating computing system equipment to be liquid immersion cooled. The liquid-liquid heater exchanger unit is modular at the server rack level as it allows the ratio of IT equipment to cooling units to be adjusted according to the thermal characteristics of the IT equipment. The liquid-liquid heater exchanger unit is constructed from commodity components readily available from the IT industry and the offshore marine and oil process heating industry. Some modifications to these commodity components are used to adapt them into a functioning cooling unit. The use of fans is advantageous where equipment cost is a consideration. The use of small marine pumps, while more expensive, is advantageous where higher flow rates or better energy efficiency are desired. The fans (or pumps) are sized such that they provide an N+M redundancy for cooling fluid circulation. An integrated power supply, for example, a commodity 1U/2U/3U power supply, that is included in the server chassis is used to provide power to the fans or pumps. Two strainer baskets are integrated into the server chassis and are constructed from common wire mesh. The strainer baskets provide a low cost mechanism to remove bulk contaminants from the circulating immersion cooling fluid, e.g., barcode labels, and are easily serviced.

Suitable liquid-liquid heat exchangers include, but are not limited to, tube and fin heat exchangers constructed, for example, from metals such as copper and aluminum. In one embodiment, the liquid-liquid heat exchanger has approximate dimensions of 16 inches×16 inches×2.5 inches (41 cm×41 cm×6.4 cm). These dimensions provide for approximately 25 ft$^2$ (2.3 m$^2$) of surface area in the fins. This is sufficient to provide 20 kW of heat rejection for a 15° C. entering temperature differential between the cooling water and hot immersion cooling fluid. Tube and fin heat exchangers are commodity items used in the marine industry, the HVAC industry and are widely available. In one embodiment, the tube and fin heat exchangers include copper tubing having a diameter of from about ⅜ inch to about ½ inch, (0.95 cm to 1.3 cm) and arranged in a multipass configuration. The copper tubing is routed through the top of the unit chassis and is attached to the source of the secondary cooling fluid, e.g., water. In one embodiment, standard, possibly dripless, quick connect fittings are used to attach the copper tubing from the liquid-liquid heat exchanger to cooling water supply and return lines.

Returning to FIG. 1, the system also includes at least one heat generating computing component 110 attached to and supported by the computing system equipment holder. There is at least one heat generating computing component disposed in the volume of cooling liquid. Suitable heat generating computing components include conventional server chassis containing computing system and sever components. All of the required wiring for power and communication to and from the liquid-liquid heat exchanger units and the heat generating computing system components is in accordance with known and available equipment and methods for wiring within an immersion cooling computing environment.

In general, FIG. 1 provides a view from the top of an embodiment of a system for immersion cooling of computing system equipment using an IBC tank with the top removed and two computing system equipment holders or racks placed inside. The outer dimensions of the tote are approximately 40 inches×48 inches (101 cm×122 cm). The top of the tank is cut away at the HDPE tank cut line and is filled with immersion cooling fluid that is a typical mineral oil immersion fluid. The two computing system equipment holders or racks are side by side, bolted together if desired for increased rigidity. The HDPE runners rest on the bottom of the tank and support both the rack frames and IT equipment in the racks. The server racks are typical 1U and 2U IT equipment racks. As used herein, the nomenclature '1U' '2U' '3U' describes the height of IT equipment (servers) within a rack and is also denoted 'RU', or rack unit, rather than 'U'. One 'U' is approximately 1.75". A typical rack is 42U in height, thus capable of holding 42 servers, each 1U in height. Two different configurations are shown for the liquid-liquid heat exchanger units 108. A first configuration 111 that is 2U or 3U configuration and is mounted inside the computing system equipment holder or rack adjacent to standard heat generating server chassis equipment. Hot oil exits the standard heat generating server chassis and flows laterally 112 towards the first configuration of the liquid-liquid heat exchanger unit. The immersion cooling fluid enters from the top and exits at the bottom between the two HDPE runners. The cooled immersion cooling fluid then flows laterally at the bottom of the tank and enters IT equipment from the bottom. It rises vertically within the equipment, gaining heat, and exits through the top of the equipment. The second configuration 113 is a 1U configuration and is mounted outside the computing system equipment holder or rack, utilizing the additional space shown in the top view. This configuration provides an extra 10% of usable computing system equipment holder or rack space. In this configuration, the cooling fluid flows across the width of the computing system equipment holders or racks 114, and the HDPE runners have holes drilled in them to permit cooled oil to flow through them and up into the IT equipment. Depending upon the dimensions of the oil tank, racks and IT equipment, different sized cooling units 111, 113 can be used in different locations. Larger units, 4U or 5U are also possible based on low cost server chassis.

Figure 8:
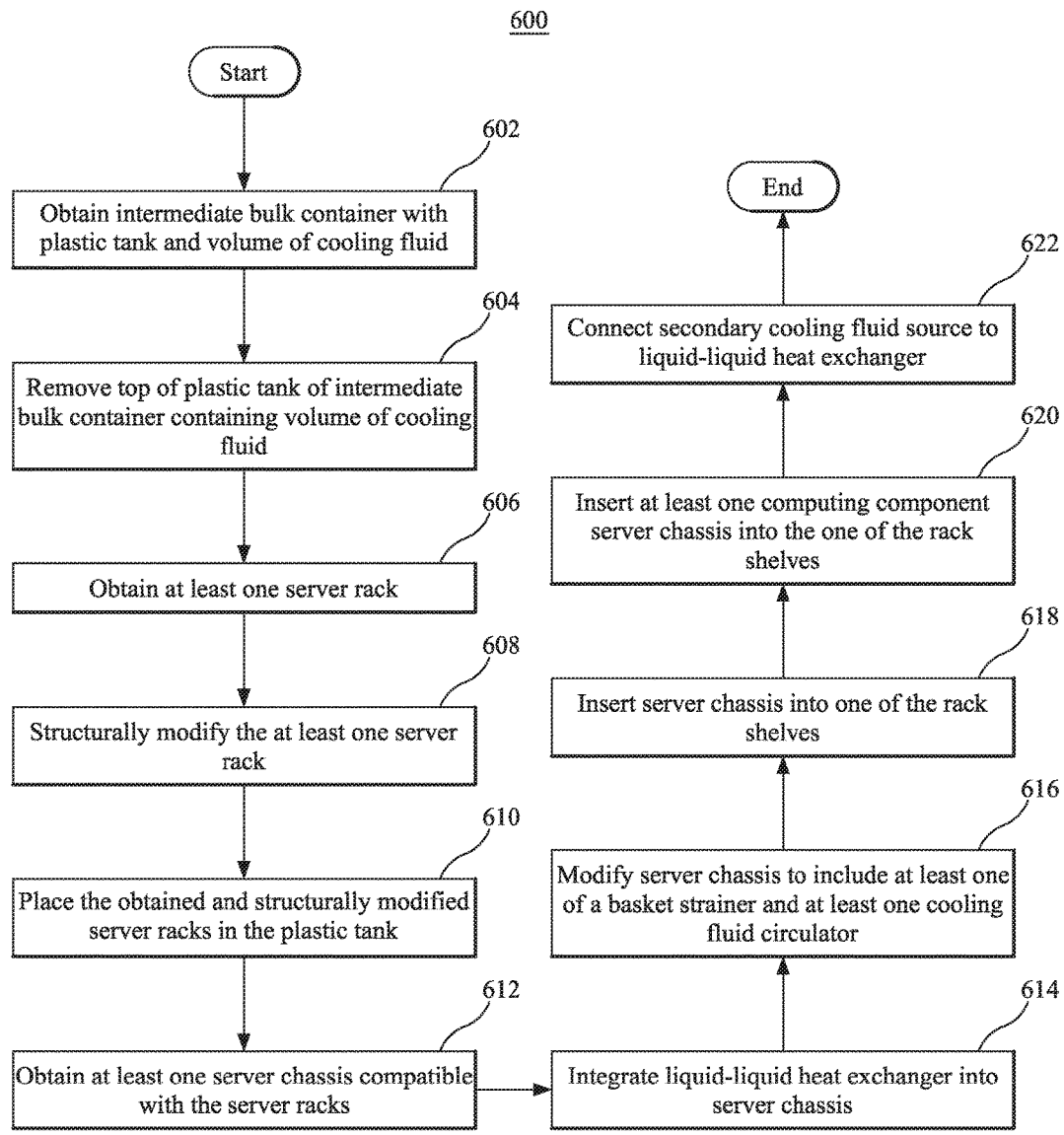
FIG. 8 is a flow chart illustrating an embodiment of a method for immersion cooling computing system equipment.

Referring to FIG. 8, exemplary embodiments are also directed to a method for immersion cooling computing system equipment 600. An intermediate bulk container having a high density polyethylene tank that contains a volume of cooling fluid such as dielectric oil is obtained 602. In one embodiment, the intermediate bulk container is used to ship the volume of cooling fluid to a given site such as a remote land based or sea based site. The top of the high density polyethylene tank in the intermediate bulk container and containing the volume of dielectric oil is removed 604. In one embodiment, the top is removed on site, for example, but cutting the top off the plastic tank. The plastic tank is cut in accordance with the location of any rounded corners on the plastic tank and the volume and depth of the cooling fluid within the plastic tank.

At least one server rack is obtained 606 and is structurally modified as needed 608 to improve the strength and structurally rigidity of the server rack. The obtained and modified server racks are placed in the dielectric oil in the tank 610 through the opening in the top of the plastic tank. Each server rack is placed in the plastic tank such that a rack back is disposed adjacent a bottom of the tank and a plurality of rack shelves disposed in the server rack and extending vertically through the container. At least one server chassis compatible with the sever rack is obtained 612. A liquid-liquid heat exchanger is integrated into the server chassis 614. In one embodiment, the server chassis is modified to also include at least one of a basket strainer and at least one cooling fluid circulator 616. The liquid-liquid heat exchanger is placed in the server chassis such that the at least one cooling fluid circulator is disposed between the basket strainer and the liquid-liquid heat exchanger. The server chassis is inserted into one of the plurality of rack shelves 618 such that the liquid-liquid heat exchanger is in communication with the volume of dielectric oil. At least one computing component server chassis is inserted into one of the plurality of rack shelves and into the volume of dielectric oil 620. The computing component server chassis containing heat generating computing components. A secondary cooling fluid source is connected to the liquid-liquid heat exchanger 622. The system for immersion cooling of computing system equipment can then be operated to provide the desired computing services while cooling the heat generating computing system components by circulating the immersion cooling fluid within the tank through the liquid-liquid heat exchanger and routing the secondary cooling fluid through the liquid-liquid heat exchanger from a source external to the tank.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A system for immersion cooling computing system equipment, the system comprising: a container; a volume of cooling liquid disposed in the container; a computing system equipment holder disposed in the volume of cooling liquid; a server chassis attached to and supported by the computing system equipment holder, the server chassis being disposed vertically in the volume of cooling liquid; a liquid-liquid heat exchanger being disposed in the server chassis; and the liquid-liquid heat exchanger attached to and supported by the computing system equipment holder, the liquid-liquid heat exchanger being disposed in the volume of cooling liquid.

2. The system of claim 1, wherein the container comprises an intermediate bulk container comprising:
   a pallet base;
   a metal frame extending up from the pallet base; and
   a plastic tank support by the pallet base and surrounded by the metal frame, the volume of cooling liquid being disposed in the plastic tank.

3. The system of claim 2, wherein the plastic tank comprises high density polyethylene.

4. The system of claim 1, wherein the cooling liquid comprises dielectric oil.

5. The system of claim 1, wherein the computing system equipment holder comprises a server rack comprising:
   a rack top;
   a rack bottom opposite the rack top;
   a rack front extending between the rack top and the rack bottom;
   a rack back opposite the rack front and extending between the rack top and the rack bottom; and
   a plurality of rack shelves disposed in the server rack and extending from the rack front to the rack back parallel to the rack top and the rack bottom;
   wherein the server rack is disposed in the container with the rack back adjacent a bottom of the container and the plurality of rack shelves extending vertically through the container.

6. The system of claim 5, wherein the computing system equipment holder further comprises a plurality of plastic runners disposed between the rack back and the bottom of the container, each plastic runner comprising a thickness of up to about three inches.

7. The system of claim 5, wherein the plurality of rack shelves is spaced from each other along the rack front and the rack back of the server rack from the rack bottom to the rack top.

8. The system of claim 5, wherein each rack shelf comprises a height along the rack front and the rack back, the height comprising from one rack unit to seven rack units.

9. The system of claim 5, wherein the computing system equipment holder comprises a plurality of server racks.

10. The system of claim 5, wherein the liquid-liquid heat exchanger is disposed on one of the plurality of rack shelves.

11. The system of claim 1, wherein:
the server chassis comprises:
heat generating computing components; and
at least one cooling fluid circulator; and
the at least one cooling fluid circulator being disposed between the heat generating computing components and the liquid-liquid heat exchanger.

12. The system of claim 1, wherein:
the server chassis comprises:
a basket strainer; and
at least one cooling fluid circulator; and
the at least one cooling circulator is disposed between the basket strainer and the liquid-liquid heat exchanger.

13. The system of claim 1, further comprising at least one heat generating computing component attached to and supported by the computing system equipment holder, the at least one heat generating computing component being disposed in the volume of cooling liquid.

14. The system of claim 1, further comprising a plurality of liquid-liquid heat exchangers, each liquid-liquid heat exchanger being attached to and supported by the computer equipment holder, and each liquid-liquid heat exchanger being disposed in the volume of cooling liquid.

15. A system for immersion cooling computing system equipment, the system comprising:
an intermediate bulk container comprising a high density polyethylene tank;
a volume of dielectric oil disposed in the tank;
at least one server rack disposed in the dielectric oil, the server rack comprising:
a rack top;
a rack bottom opposite the rack top;
a rack front extending between the rack top and the rack bottom;
a rack back opposite the rack front and extending between the rack top and the rack bottom; and
a plurality of rack shelves disposed in the server rack and extending from the rack front to the rack back parallel to the rack top and the rack bottom, wherein the server rack is disposed in the container with the rack back adjacent a bottom of the tank and the plurality of rack shelves extending vertically through the container;
a server chassis attached to and supported by the server rack, the server chassis being disposed on one of the plurality of rack shelves in the volume of dielectric oil; and
a liquid-liquid heat exchanger disposed in the sever chassis and fluid communication with the volume of dielectric oil.

16. The system of claim 15, wherein:
the server chassis further comprises:
a basket strainer; and
at least one cooling fluid circulator; and
the at least one cooling circulator is disposed between the basket strainer and the liquid-liquid heat exchanger.

17. The system of claim 15, further comprising a plurality of the computing component server chasses, each computing component server chassis being disposed on one of the plurality of rack shelves in the volume of dielectric oil and comprising:
heat generating computing components; and
at least one cooling fluid circulator.

18. A method for immersion cooling computing system equipment, the method comprising:
removing a top of a high density polyethylene tank in an intermediate bulk container comprising a volume of dielectric oil;
placing at least one server rack in the dielectric oil in the tank such that a rack back is disposed adjacent a bottom of the tank and a plurality of rack shelves is disposed in the server rack and extending vertically through the container;
integrating a liquid-liquid heat exchanger into a server chassis;
inserting the server chassis into one of the plurality of rack shelves such that the liquid-liquid heat exchanger is in communication with the volume of dielectric oil; and
inserting at least one computing component server chassis into one of the plurality of rack shelves in the volume of dielectric oil, the computing component server chassis comprising heat generating computing components.

19. The method of claim 18, wherein integrating the liquid-liquid heat exchanger into the server chassis further comprises:
modifying the server chassis to include a basket strainer and at least one cooling fluid circulator; and
placing the liquid-liquid heat exchanger in the server chassis such that the at least one cooling fluid circulator is disposed between the basket strainer and the liquid-liquid heat exchanger.

* * * * *